US012022690B2

(12) United States Patent
Lim et al.

(10) Patent No.: US 12,022,690 B2
(45) Date of Patent: Jun. 25, 2024

(54) METHOD OF MANUFACTURING SEMICONDUCTOR ELEMENT THAT INCLUDES WET ETCHING SEMICONDUCTOR LAYER THAT INCLUDES CRYSTALLIZED TWO-DIMENSIONAL LAYERS

(71) Applicants: Samsung Display Co., Ltd., Yongin-Si (KR); Industry-Academic Cooperation Foundation, Yonsei University, Seoul (KR)

(72) Inventors: Jun Hyung Lim, Seoul (KR); Hyungjun Kim, Seoul (KR); Hyungjun Kim, Seoul (KR); Young Jun Kim, Seoul (KR); Ju Sang Park, Seoul (KR); Whang Je Woo, Seoul (KR)

(73) Assignees: Samsung Display Co., Ltd., Yongin-si (KR); Industry-Academic Cooperation Foundation, Yonsei University, Seoul (KR)

( * ) Notice: Subject to any disclaimer, the term of this patent is extended or adjusted under 35 U.S.C. 154(b) by 513 days.

(21) Appl. No.: 17/244,857

(22) Filed: Apr. 29, 2021

(65) Prior Publication Data
US 2021/0343817 A1 Nov. 4, 2021

(30) Foreign Application Priority Data
Apr. 29, 2020 (KR) .................. 10-2020-0052093

(51) Int. Cl.
H10K 59/121 (2023.01)
H01L 21/02 (2006.01)
(Continued)

(52) U.S. Cl.
CPC ......... *H10K 59/1213* (2023.02); *H10K 71/00* (2023.02); *H01L 21/02568* (2013.01);
(Continued)

(58) Field of Classification Search
CPC ........... H10K 59/1201; H10K 59/1213; H10K 71/00; H10K 71/40; H10K 71/421;
(Continued)

(56) References Cited

U.S. PATENT DOCUMENTS 9,629,251 B2 4/2017 Currie et al.
2021/0299789 A1* 9/2021 Glavin ............... B23K 26/0846

OTHER PUBLICATIONS

"Production and processing of graphene and related materials", C. Backes et al., 2020 2D Mater. 7 022001 DOI 10.1088/2053-1583/ab1e0a (Year: 2020).*

(Continued)

*Primary Examiner* — Matthew E. Gordon
(74) *Attorney, Agent, or Firm* — Innovation Counsel LLP

(57) ABSTRACT

A method may be used for manufacturing a semiconductor element. The method may include the following steps: preparing a substrate; forming a semiconductor layer on the substrate, wherein the semiconductor layer includes crystallized two-dimensional layers; forming a source electrode and a drain electrode on the semiconductor layer; forming an semiconductor member by wet etching the semiconductor layer using sodium hypochlorite as an etchant, wherein the wet etching results in a residue; and removing the residue using purified water and an inert gas.

21 Claims, 5 Drawing Sheets

(51) Int. Cl.
  *H01L 27/12*   (2006.01)
  *H01L 29/24*   (2006.01)
  *H01L 29/66*   (2006.01)
  *H01L 29/76*   (2006.01)
  *H01L 29/786*  (2006.01)
  *H10K 59/12*   (2023.01)
  *H10K 71/00*   (2023.01)

(52) U.S. Cl.
  CPC ...... *H01L 21/0262* (2013.01); *H01L 27/1225* (2013.01); *H01L 27/127* (2013.01); *H01L 29/24* (2013.01); *H01L 29/66969* (2013.01); *H01L 29/7606* (2013.01); *H01L 29/78696* (2013.01); *H10K 59/1201* (2023.02)

(58) Field of Classification Search
  CPC ............ H10K 71/441; H01L 21/02568; H01L 21/0262; H01L 27/1225; H01L 27/127; H01L 29/24; H01L 29/66969; H01L 29/7606; H01L 29/78696
  USPC .......................................................... 438/23
  See application file for complete search history.

(56) References Cited

OTHER PUBLICATIONS

A. Aracena, R. Rubilar and O. Jerez & D. Carvajal, "Dissolution of MoS2 concentrate using NaClO from 283 to 373 K", Canadian Metallurgical Quarterly 2015 vol. 54 No. 4, 455-459 pages.

Roshan B. Bhappu, Dexter H. Reynolds and William S. Stahmann, "Studies on Hypochlorite leaching of Molybdenite" Circular 66, 1963, 24 pages.

* cited by examiner

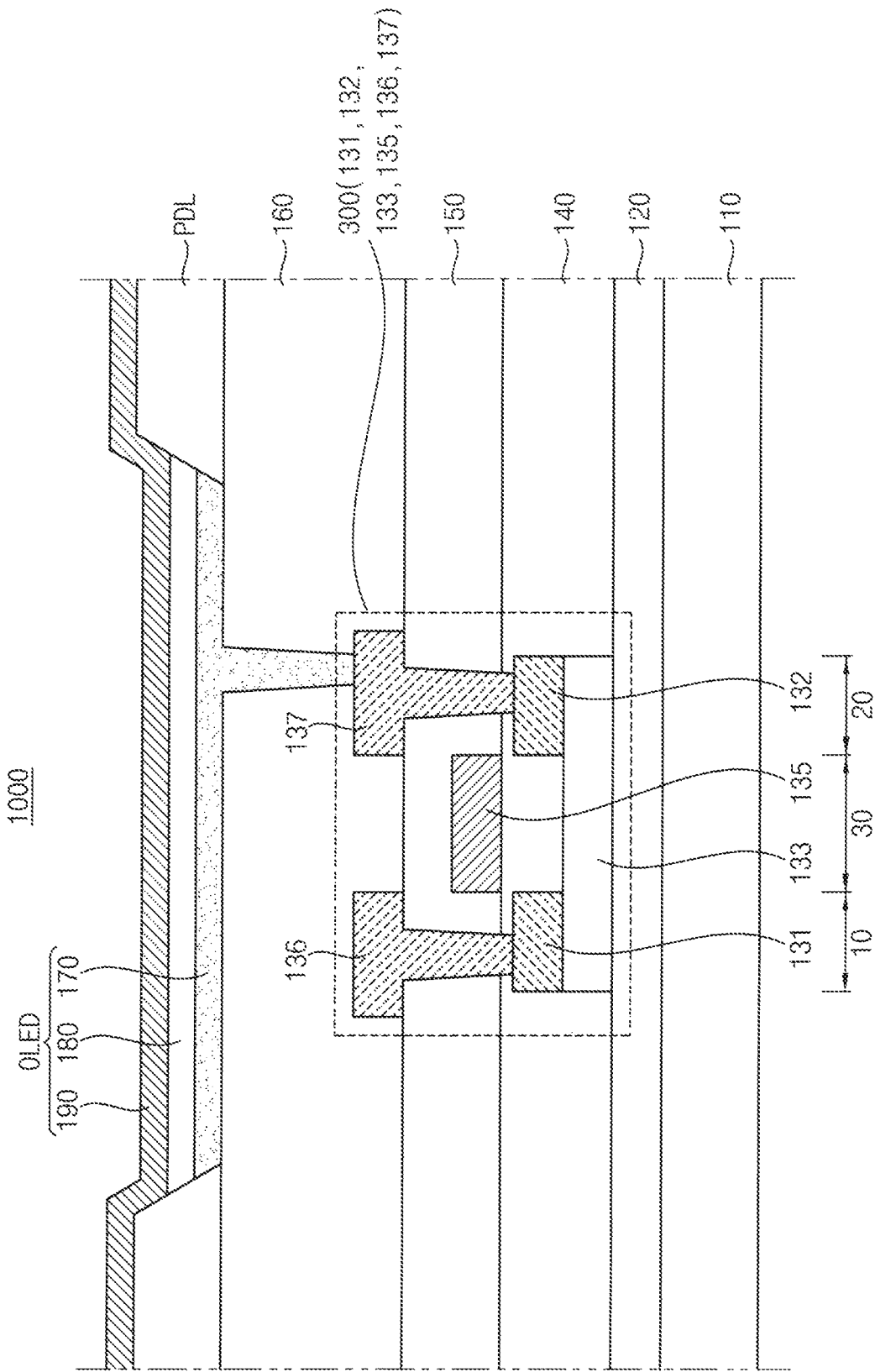

METHOD OF MANUFACTURING SEMICONDUCTOR ELEMENT THAT INCLUDES WET ETCHING SEMICONDUCTOR LAYER THAT INCLUDES CRYSTALLIZED TWO-DIMENSIONAL LAYERS

CROSS-REFERENCE TO RELATED APPLICATION(S)

This application claims priority to Korean Patent Application No. 10-2020-0052093, filed on Apr. 29, 2020; the Korean Patent Application is incorporated by reference.

BACKGROUND

Field

The technical field relates to a method of manufacturing a semiconductor element.

Related Art

A display device may display images according to input signals. Modern display devices include liquid crystal display devices and organic light emitting display devices.

A display device may include a display element and a transistor for controlling the display element. The transistor may include an active member. In order to form the active member, an active layer needs to be etched. If the active layer is etched through a dry etching process, a set of large equipment is typically required. In general, the dry etching process takes a long time.

SUMMARY

Embodiments may be related to a method of manufacturing a display device that includes a semiconductor element.

A method of manufacturing a semiconductor element according to an embodiment may include the following steps: preparing a substrate, forming an active pattern having a crystallized two-dimensional layered structure on the substrate and including a first region, a second region spaced apart from the first region, and a third region between the first region and the second region; forming a source electrode on the first region and forming a drain electrode on the second region; forming an active pattern by wet etching the active layer by applying sodium hypochlorite (NaOCl) to the active layer; and removing a residue generated by the wet etching using purified water and an inert gas.

According to an embodiment, the active layer may include at least one of molybdenum compounds including molybdenum disulfide ($MoS_2$), molybdenum diselenide ($MoSe_2$), and molybdenum ditelluride ($MoTe_2$).

According to an embodiment, the molybdenum disulfide ($MoS_2$) may be produced by synthesizing molybdenum chloride ($MoCl_5$) and hydrogen sulfide ($H_2S$). The synthesis may be performed at 650 degrees to 750 degrees Celsius for 13 minutes to 17 minutes.

According to an embodiment, the molybdenum disulfide ($MoS_2$) may be produced by synthesizing molybdenum chloride ($MoCl_5$) and hydrogen sulfide ($H_2S$). The synthesis may be performed at 700 degrees Celsius for 15 minutes.

According to an embodiment, the active layer may include at least one of tungsten compounds including tungsten disulfide ($WS_2$), tungsten diselenide ($WSe_2$), and tungsten ditelluride ($WTe_2$).

According to an embodiment, the active layer includes at least one of zirconium compounds including zirconium disulfide ($ZrS_2$) and zirconium diselenide ($ZrSe_2$).

According to an embodiment, the active layer may include at least one of hafnium compounds including hafnium disulfide ($HfS_2$) and hafnium diselenide ($HfSe_2$).

According to an embodiment, the active layer includes at least one of platinum compounds including platinum disulfide ($PtS_2$) and platinum diselenide ($PtSe_2$).

According to an embodiment, the active layer includes at least one of rhenium compounds including rhenium disulfide ($ReS_2$) and rhenium diselenide ($ReSe_2$).

According to an embodiment, forming the source electrode and the drain electrode proceeds through a lithography process.

According to an embodiment, the source electrode and the drain electrode include at least one or more of titanium (Ti) and silver (Ag).

According to an embodiment, the method may further include forming a gate insulating layer on the active pattern, forming a gate electrode on the gate insulating layer, and forming an interlayer insulating layer on the gate electrode.

According to an embodiment, the method may further include forming a first contact hole exposing the source electrode in the interlayer insulating layer and the gate insulating layer, and forming a source pattern filling the first contact hole on the interlayer insulating layer.

According to an embodiment, the method may further include forming a second contact hole exposing the drain electrode in the interlayer insulating layer and the gate insulating layer and forming a drain pattern filling the second contact hole on the interlayer insulating layer.

According to an embodiment, the inert gas contains nitrogen ($N_2$).

According to an embodiment, the inert gas contains argon (Ar).

According to an embodiment, the inert gas includes a mixed gas of nitrogen ($N_2$) and argon (Ar).

According to an embodiment, the sodium hypochlorite (NaOCl) is applied through a dropper.

According to an embodiment, the method may further include forming a buffer layer on the substrate, after the step of preparing the substrate and before the step of forming the active layer.

The method of manufacturing a semiconductor element according to an embodiment may include forming an active pattern having a crystallized two-dimensional layered structure on the substrate forming an active pattern by wet etching the active layer by applying sodium hypochlorite (NaOCl) to the active layer, and removing a residue generated by the wet etching using purified water and an inert gas.

An embodiment may be related to a method for manufacturing a semiconductor element. The method may include the following steps: preparing a substrate; forming a semiconductor layer on the substrate, wherein the semiconductor layer may include crystallized two-dimensional layers; forming a source electrode and a drain electrode on the semiconductor layer; forming an semiconductor member by wet etching the semiconductor layer using sodium hypochlorite as an etchant, wherein the wet etching may result in a residue; and removing the residue using purified water and an inert gas.

The semiconductor layer may include at least one of molybdenum disulfide, molybdenum diselenide, and molybdenum ditelluride.

The molybdenum disulfide may be produced by synthesizing molybdenum chloride and hydrogen sulfide at a temperature in a range of 650 degrees to 750 degrees Celsius for a time length in a range of 13 minutes to 17 minutes.

The molybdenum disulfide may be produced by synthesizing molybdenum chloride and hydrogen sulfide at 700 degrees Celsius for 15 minutes.

The semiconductor layer may include at least one of tungsten disulfide, tungsten diselenide, and tungsten ditelluride.

The semiconductor layer may include at least one of zirconium disulfide and zirconium diselenide.

The semiconductor layer may include at least one of hafnium disulfide and hafnium diselenide.

The semiconductor layer may include at least one of platinum disulfide and platinum diselenide.

The semiconductor layer may include at least one of rhenium disulfide and rhenium diselenide.

The source electrode and the drain electrode may be formed through a lithography process.

The source electrode and the drain electrode include one or more of titanium and silver.

The method may include the following steps: forming a gate insulating layer on the semiconductor member; forming a gate electrode on the gate insulating layer; and forming an interlayer insulating layer on the gate electrode.

The method may include the following steps: forming a first contact hole in the interlayer insulating layer and the gate insulating layer, the first contact hole exposing the source electrode; and forming a source member on the interlayer insulating layer, the source member filling the first contact hole.

The method may include the following steps: forming a second contact hole in the interlayer insulating layer and the gate insulating layer, the second contact hole exposing the drain electrode; and forming a drain member on the interlayer insulating layer, the drain member filling the second contact hole.

The inert gas may contain nitrogen.

The inert gas may contain argon.

The inert gas may include a mixed gas of nitrogen and argon.

The sodium hypochlorite may be applied through a dropper to the semiconductor layer.

The method may include forming a buffer layer on the substrate after the step of preparing the substrate and before the step of forming the semiconductor layer.

According to embodiments, in a method of manufacturing a semiconductor element, the process of etching an active/semiconductor layer may be substantially simple, the time required for etching the active/semiconductor layer can be minimized, and/or the cost of etching the active/semiconductor layer can be saved.

BRIEF DESCRIPTION OF THE DRAWINGS

FIG. 1 is a cross-sectional view illustrating a display device according to an embodiment.

DETAILED DESCRIPTION

Figure 2A:
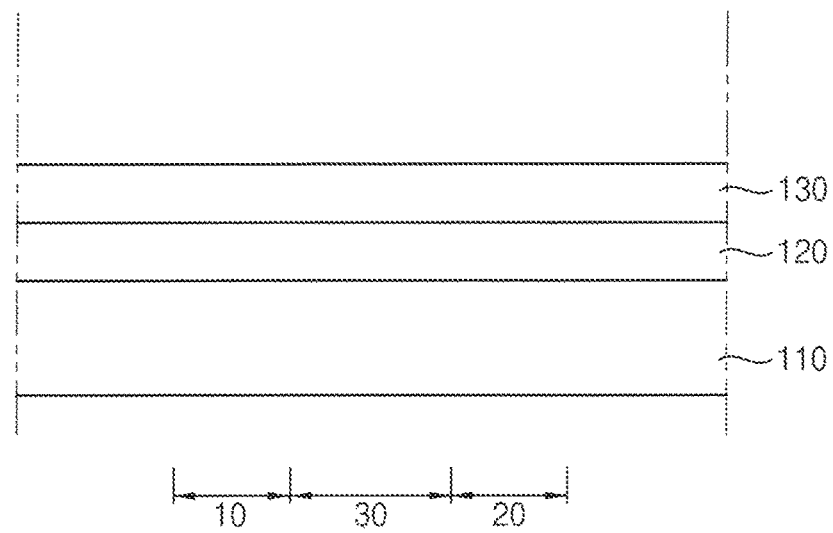
FIG. 2A, FIG. 2B, FIG. 2C, FIG. 2D, FIG. 2E, FIG. 2F, and FIG. 2G are diagrams illustrating structures formed in a method of manufacturing a semiconductor element according to at least an embodiment.

Illustrative embodiments are described with reference to the accompanying drawings. Although the terms "first," "second," etc. may be used to describe various elements, these elements should not be limited by these terms. These terms may be used to distinguish one element from another element. A first element may be termed a second element without departing from teachings of one or more embodiments. The description of an element as a "first" may not require or imply the presence of a second element or other elements. The terms "first," "second," etc. may be used to differentiate different categories or sets of elements. For conciseness, the terms "first," "second," etc. may represent "first-type (or first-set)," "second-type (or second-set)," etc., respectively. The term "connect" may mean "electrically connect" or "electrically connected through no intervening transistor." The term "insulate" may mean "electrically insulate" or "electrically isolate." The term "conductive" may mean "electrically conductive." The term "semiconductor element" may mean "switching element" or "transistor." The term "pattern" may mean "member." A listing of materials may mean at least one of the listed materials. The term "active" may mean "semiconductor." The term "include" may mean "be formed of."

FIG. 1 is a cross-sectional view illustrating a display device according to an embodiment.

Referring to FIG. 1, a display device 1000 may include a substrate 110, a buffer layer 120, a gate insulating layer 140, an interlayer insulating layer 150, a via insulating layer 160, a semiconductor element 300, a pixel defining layer (PDL) and an organic light emitting diode (OLED). The semiconductor element 300 may include a source electrode 131, a drain electrode 132, an active pattern 133, a gate electrode 135, a source pattern 136, and a drain pattern 137. The organic light emitting diode OLED may include a lower electrode 170, an emitting layer 180, and an upper electrode 190.

The substrate 110 may include one or more transparent and/or opaque materials. The substrate 110 may be formed of a flexible transparent resin. The substrate 110 may include a first organic layer, a first barrier layer, a second organic layer, and a second barrier layer that are sequentially stacked. The first barrier layer and the second barrier layer may include an inorganic material. The substrate 110 may be/include at least one of a quartz substrate, a synthetic quartz substrate, a calcium fluoride substrate, a fluorine-doped quartz substrate, a soda lime glass substrate, and a non-alkali glass substrate.

The buffer layer 120 may be disposed on the substrate 110. The buffer layer 120 may cover an entire face or surface of the substrate 110. The buffer layer 120 may prevent diffusion of metal atoms or impurities from the substrate 110 to the semiconductor element 300. If the surface of the substrate 110 is not uniform, the buffer layer 120 may improve the flatness of the surface of the substrate 110. Two or more buffer layers may be provided on the substrate 110. The buffer layer 120 may be optional. The buffer layer 120 may include a silicon compound, a metal oxide, or the like. For example, the buffer layer 120 may include at least one of silicon oxide (SiOx), silicon nitride (SiNx), silicon oxynitride (SiOxNy), silicon oxycarbide (SiOxCy), silicon carbonitride (SiCxNy), silicon oxycarbide (SiOxCy), aluminum oxide (AlOx), aluminum nitride (AlNx), tantalum oxide (TaOx), hafnium oxide (HfOx), zirconium oxide (ZrOx), titanium oxide (TiOx), and the like.

The active pattern 133 may be disposed on the buffer layer 120. The active pattern 133 may include two-dimensional layers each including a single layer of atoms. The active pattern 133 may determine the performance of the semiconductor element 300.

The active pattern 133 may include a transition metal dichalcogenide (TMDC) and graphene. The transition metal dichalcogenide may include at least one of molybdenum disulfide ($MoS_2$), molybdenum diselenide ($MoSe_2$), molybdenum ditelluride ($MoTe_2$), tungsten disulfide ($WS_2$), tungsten diselenide ($WSe_2$), Tungsten ditelluride ($WTe_2$), zirconium disulfide ($ZrS_2$), zirconium diselenide ($ZrSe_2$), hafnium disulfide ($HfS_2$), hafnium diselenide ($HfSe_2$), platinum disulfide ($PtS_2$), platinum diselenide ($PtSe_2$), rhenium disulfide ($ReS_2$), rhenium diselenide ($ReSe_2$), and the like. The graphene may include at least one of hexagonal boron nitride graphene, boron nitride co-doped graphene, and the like. The active pattern 133 may be formed of the molybdenum disulfide ($MoS_2$).

The active pattern 133 may be formed by a wet etching process. The wet etching process may be performed using sodium hypochlorite (NaOCl).

The active pattern 133 may have a thinner thickness, higher mobility, a higher on/off current ratio, and/or higher stability than a silicon-based active pattern or a metal oxide-based active pattern. The active pattern 133 may have a nanoplatelet structure, may have a band gap, and can suitable for the semiconductor element 300. Moreover, since the active pattern 133 has flexibility, it can be used for the semiconductor element 300 included in the flexible display device. The active pattern 133 may serve as a channel electrically connecting the source electrode 131 and the drain electrode 132.

The active pattern 133 may include a first region 10, a second region 20 spaced apart from the first region 10, and a third region 30 between the first region 10 and the second region 20.

The source electrode 131 may be disposed on the first region 10 of the active pattern 133. The drain electrode 132 may be disposed on the second region 20 of the active pattern 133. The source electrode 131 and the drain electrode 132 may include titanium (Ti) and/or silver (Ag). The source electrode 131 and the drain electrode 132 may include a metal, an alloy, a metal nitride, a conductive metal oxide, a transparent conductive material, and the like. For example, the source electrode 131 and the drain electrode 132 may include gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), molybdenum (Mo), scandium (Sc), neodymium (Nd), iridium (Ir), alloy containing aluminum (Al), aluminum nitride (AlNx), alloy containing silver (Ag), tungsten (W), tungsten nitride (WNx), alloy containing copper (Cu), alloy containing molybdenum (Mo), titanium nitride (TiNx), tantalum nitride (TaNx), strontium ruthenium oxide (SrRuxOy), zinc oxide (ZnOx), indium tin oxide (ITO), tin oxide (SnOx), indium oxide (InOx), gallium oxide (GaOx), indium zinc oxide (IZO), and the like.

The source electrode 131 and the drain electrode 132 may be formed through a lithography process.

The gate insulating layer 140 may be disposed on the buffer layer 120. The gate insulating layer 140 may cover the active pattern 133, the source electrode 131, and the drain electrode 132. The gate insulating layer 140 may have a substantially flat top surface without generating a step around the active pattern 133, the source electrode 131, and the drain electrode 132. The gate insulating layer 140 may cover the active pattern 133, the source electrode 131, and the drain electrode 132 on the buffer layer 120, and may be disposed along a profile of the active pattern 133, the source electrode 131 and the drain electrode 132 with a substantially uniform thickness.

The gate insulating layer 140 may include a material having a high dielectric constant. For example, the gate insulating layer 140 may include a transition metal such as hafnium, zirconium, or tantalum.

The gate electrode 135 may be disposed on the gate insulating layer 140 and may overlap the third region 30. The gate electrode 135 may include a metal, an alloy, a metal nitride, a conductive metal oxide, a transparent conductive material, and the like. For example, the gate electrode 135 may include gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), molybdenum (Mo), scandium (Sc), neodymium (Nd), iridium (Ir), alloy containing aluminum (Al), aluminum nitride (AlNx), alloy containing silver (Ag), tungsten (W), tungsten nitride (WNx), alloy containing copper (Cu), alloy containing molybdenum (Mo), titanium nitride (TiNx), tantalum nitride (TaNx), strontium ruthenium oxide (SrRuxOy), zinc oxide (ZnOx), indium tin oxide (ITO), tin oxide (SnOx), indium oxide (InOx), gallium oxide (GaOx), indium zinc oxide (IZO), and the like. One or more of the foregoing materials may be used alone or in combination for forming the gate electrode 135.

The interlayer insulating layer 150 may be disposed on the gate insulating layer 140. The interlayer insulating layer 150 may cover the gate electrode 135. The interlayer insulating layer 150 may include a silicon compound, a metal oxide, or the like. For example, the interlayer insulating layer 150 may include silicon oxide (SiOx), silicon nitride (SiNx), silicon oxynitride (SiOxNy), silicon oxycarbide (SiOxCy), silicon carbonitride (SiCxNy), silicon oxycarbide (SiOxCy), aluminum oxide (AlOx), aluminum nitride (AlNx), tantalum oxide (TaOx), hafnium oxide (HfOx), zirconium oxide (ZrOx), titanium oxide (TiOx), and the like. One or more of the foregoing materials may be used alone or in combination for forming the interlayer insulating layer 150.

The source pattern 136 and the drain pattern 137 may be disposed on the interlayer insulating layer 150. The source pattern 136 may be connected to the source electrode 131 through a first contact hole formed in the gate insulating layer 140 and the interlayer insulating layer 150. The drain pattern 137 may be connected to the drain electrode 132 through a second contact hole formed in the gate insulating layer 140 and the interlayer insulating layer 150. The source pattern 136 may fill the first contact hole. The drain pattern 137 may fill the second contact hole. Each of the source pattern 136 and the drain pattern 137 may include a metal, an alloy, a metal nitride, a conductive metal oxide, a transparent conductive material, and the like. One or more of the foregoing materials may be used alone or in combination for forming the patterns 136 and 137.

Referring to FIG. 1, the semiconductor element 300 may have an upper gate structure. The semiconductor element 300 may have a lower gate structure. The semiconductor element 300 may have a dual gate structure. A separate conductive layer and/or a separate insulating layer may be disposed between at least two of the source pattern 136, the drain pattern 137, and the interlayer insulating layer 150.

The via insulating layer 160 may be disposed on the interlayer insulating layer 150. The via insulating layer 160 may cover the source pattern 136 and the drain pattern 137. The via insulating layer 160 may be thicker than the interlayer insulating layer 150. The via insulating layer 160 may have a substantially flat top surface. A planarization process may be applied to the via insulating layer 160 in order to implement a flat top surface of the via insulating layer 160. Optionally, the via insulating layer 160 may have a substantially uniform thickness and may be disposed along the profiles of the source pattern 136 and the drain pattern 137. The via insulating layer 160 may be made of an organic material and/or an inorganic material. The via insulating layer 160 may include an organic material such as a polyacrylic resin, a polyimide resin, a polyamide resin, an acrylic resin, or an epoxy resin.

The lower electrode 170 may be disposed on the via insulating layer 160. The lower electrode 170 may be connected to the drain pattern 137 through a third contact hole formed in the via insulating layer 160. The lower electrode 170 may be electrically connected to the semiconductor element 300 through the third contact hole. The lower electrode 175 may include a metal, an alloy, a metal nitride, a conductive metal oxide, a transparent conductive material, and the like. For example, the lower electrode 170 may include gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), molybdenum (Mo), scandium (Sc), neodymium (Nd), iridium (Ir), alloy containing aluminum (Al), aluminum nitride (AlNx), alloy containing silver (Ag), tungsten (W), tungsten nitride (WNx), alloy containing copper (Cu), alloy containing molybdenum (Mo), titanium nitride (TiNx), tantalum nitride (TaNx), strontium ruthenium oxide (SrRuxOy), zinc oxide (ZnOx), indium tin oxide (ITO), tin oxide (SnOx), indium oxide (InOx), gallium oxide (GaOx), indium zinc oxide (IZO), and the like. One or more of the foregoing materials may be used alone or in combination to form the lower electrode 170.

The pixel definition layer PDL may be disposed on the via insulating layer 160 and may expose at least a portion of the lower electrode 170. The pixel definition layer PDL may be made of an organic material and/or an inorganic material.

The emitting layer 180 may be disposed on a face of the lower electrode 170 exposed by the pixel defining layer PDL. The emitting layer 180 may emit red light, green light, or blue light.

The upper electrode 190 may be disposed on the pixel defining layer PDL and the emitting layer 180. The upper electrode 190 may include the same material as the lower electrode 170.

The lower electrode 170 may be an anode electrode, and the upper electrode 190 may be a cathode electrode. The lower electrode 170 may be a cathode electrode, and the upper electrode 190 may be an anode electrode.

FIGS. 2A to 2G are diagrams illustrating a method of manufacturing a semiconductor element according to at least an embodiment.

Referring to FIGS. 1 and 2A, the substrate 110 may be prepared. The substrate 110 may include a first organic layer, a first barrier layer, a second organic layer, and a second barrier layer that are sequentially stacked. The first barrier layer and the second barrier layer may include an inorganic material.

The buffer layer 120 may be formed on the substrate 110. The buffer layer 120 may be formed on an entire face (e.g., the entire top face) of the substrate 110. An active layer 130 may be formed on the buffer layer 120. The active layer 130 may include two-dimensional layers each including a single layer of atoms. At least one of the two-dimensional layers may be a crystallized two-dimensional layer.

The active layer 130 may include a first region 10, a second region 20 spaced apart from the first region 10, and a third region 30 between the first region 10 and the second region 20.

The active layer 130 may include a transition metal dichalcogenide (TMDC) and graphene. The active layer 130 may include a molybdenum compound. For example, the active layer 130 may include at least one of molybdenum disulfide ($MoS_2$), molybdenum diselenide ($MoSe_2$), and molybdenum ditelluride ($MoTe_2$).

The active layer 130 may include a tungsten compound. For example, the active layer 130 may include at least one of tungsten disulfide ($WS_2$), tungsten diselenide ($WSe_2$), and tungsten ditelluride ($WTe_2$).

The active layer 130 may include a zirconium compound. For example, the active layer 130 may include at least one of the zirconium disulfide ($ZrS_2$) and the zirconium diselenide ($ZrSe_2$).

The active layer 130 may include a hafnium compound. For example, the active layer 130 may include at least one of the hafnium disulfide ($HfS_2$) and the hafnium diselenide ($HfSe_2$).

The active layer 130 may include a platinum compound. For example, the active layer 130 may include at least one of the platinum disulfide ($PtS_2$) and the platinum diselenide ($PtSe_2$).

The active layer 130 may include a rhenium compound. For example, the active layer 130 may include at least one of the rhenium disulfide ($ReS_2$) and the rhenium diselenide ($ReSe_2$).

The graphene may include at least one of hexagonal boron nitride graphene, boron nitride co-doped graphene, and the like.

The active layer 130 may include molybdenum disulfide ($MoS_2$). The active layer 130 may include crystallized molybdenum disulfide ($MoS_2$). The molybdenum disulfide ($MoS_2$) may be produced by synthesizing molybdenum chloride ($MoCl_5$) and hydrogen sulfide ($H_2S$). The synthesis of molybdenum disulfide ($MoS_2$) may be performed at one or more temperatures in a range of about 650 degrees Celsius to about 750 degrees Celsius for a period in a range of about 13 to about 17 minutes. The synthesis of molybdenum disulfide ($MoS_2$) may be performed at about 700 degrees Celsius for about 15 minutes.

The active layer 130 may have a thinner thickness, higher mobility, a high on/off current ratio, and/or higher stability than a silicon-based active layer or a metal oxide-based active layer, for more desirable performance of the semiconductor element 300.

Figure 2B:
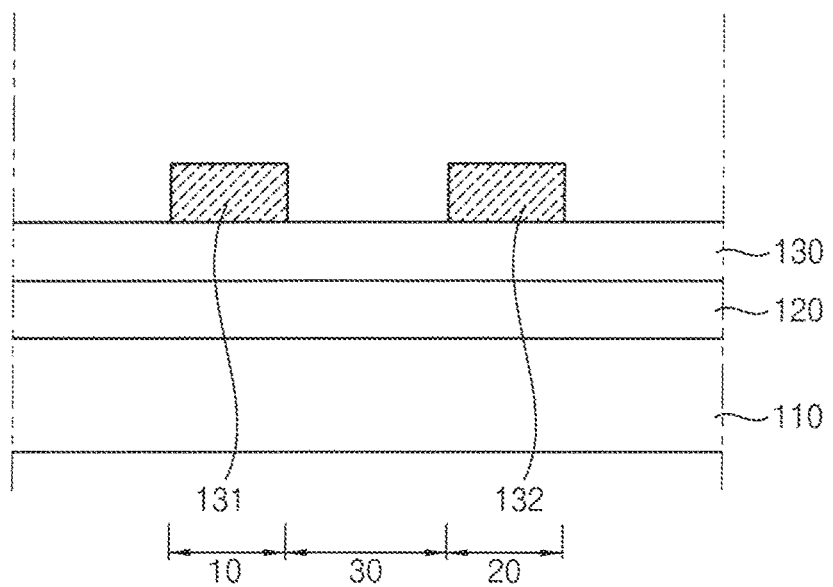

Referring to FIGS. 1 and 2B, the source electrode 131 may be disposed on the first region 10 of the active pattern 133. The drain electrode 132 may be disposed on the second region 20 of the active pattern 133. The source electrode 131 and the drain electrode 132 may include at least one of titanium (Ti) and silver (Ag). The source electrode 131 and the drain electrode 132 may include a metal, an alloy, a metal nitride, a conductive metal oxide, a transparent conductive material, and the like.

The source electrode 131 and the drain electrode 132 may be formed through a lithography process. For example, the source electrode 131 and the drain electrode 132 may be formed through a photolithography process. In an embodiment, after forming a conductive layer covering a face of the active layer 130, the conductive layer is etched by the photolithography process to form the source electrode 131 and the drain electrode 132.

Figure 2C:
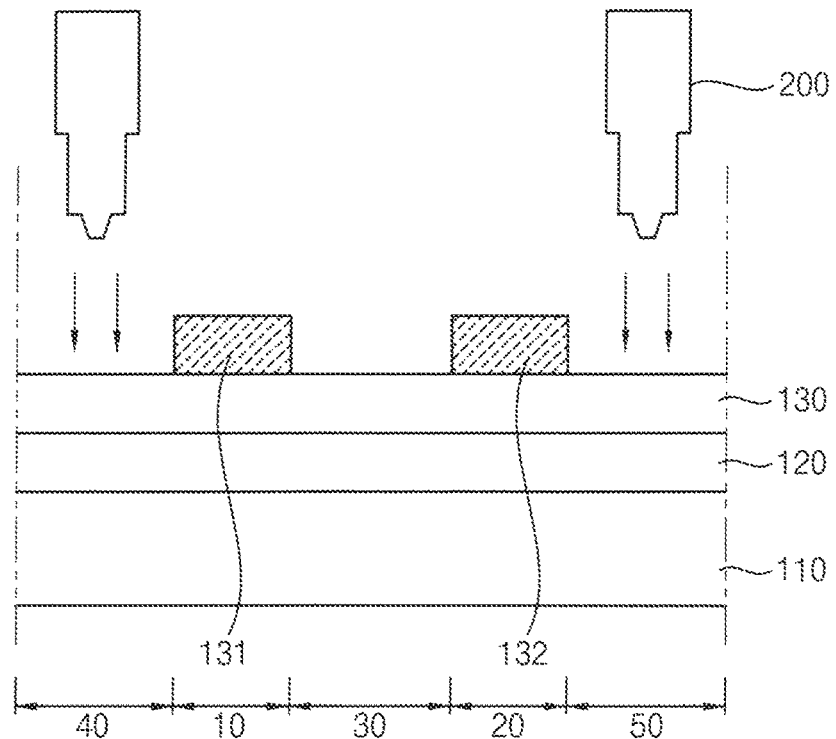
Figure 2D:
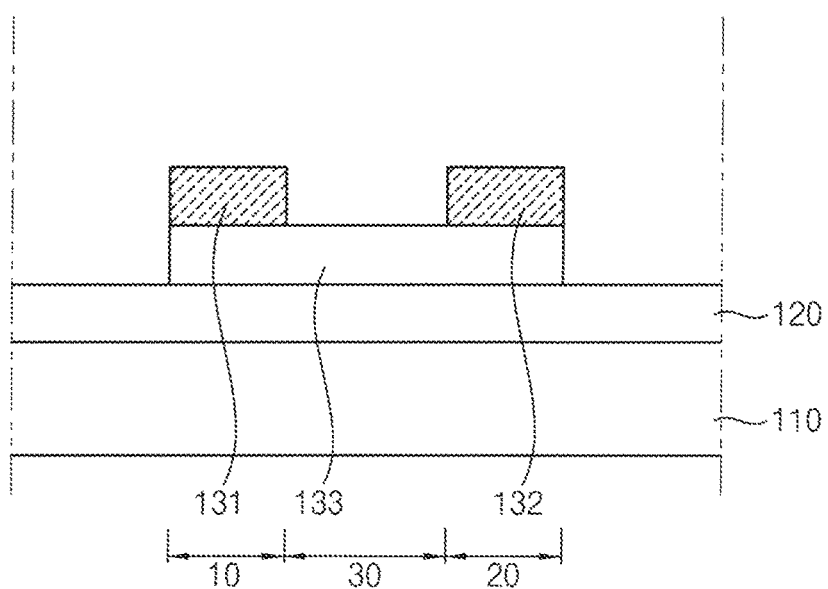

Referring to FIGS. 1, 2C, and 2D an etching process may be performed to form the active pattern 133. The etching process may be a wet etching process. When etching the active layer 130 through a dry etching process, large equipment may be required. If the active layer 130 is etched through the dry etching process, the time required for the etching may be undesirably long. Accordingly, the process yield may be undesirably low.

In embodiments, the active layer 130 may be etched using a wet etching process. Sodium hypochlorite (NaOCl) may be used in the wet etching process. The sodium hypochlorite (NaOCl) may be applied to the active layer 130 through the dropper 200. The molybdenum disulfide ($MoS_2$) of the active layer 130 may be etched by the sodium hypochlorite (NaOCl). The wet etching process may be performed at room temperature. The wet etching process may be performed for a few seconds. The wet etching process can be completed in a short time using equipment that is smaller than equipment required for the conventional dry etching method.

Referring to FIGS. 1 and 2D, after the wet etching process is performed, residues remaining on the buffer layer 120 may be removed. The removal of the residue may be performed using purified water and an inert gas. For example, after spraying the purified water, the residue may be removed using the inert gas. The inert gas may include nitrogen ($N_2$). The inert gas may include argon (Ar). The inert gas may include a mixed gas that includes nitrogen ($N_2$) and argon (Ar).

Figure 2E:
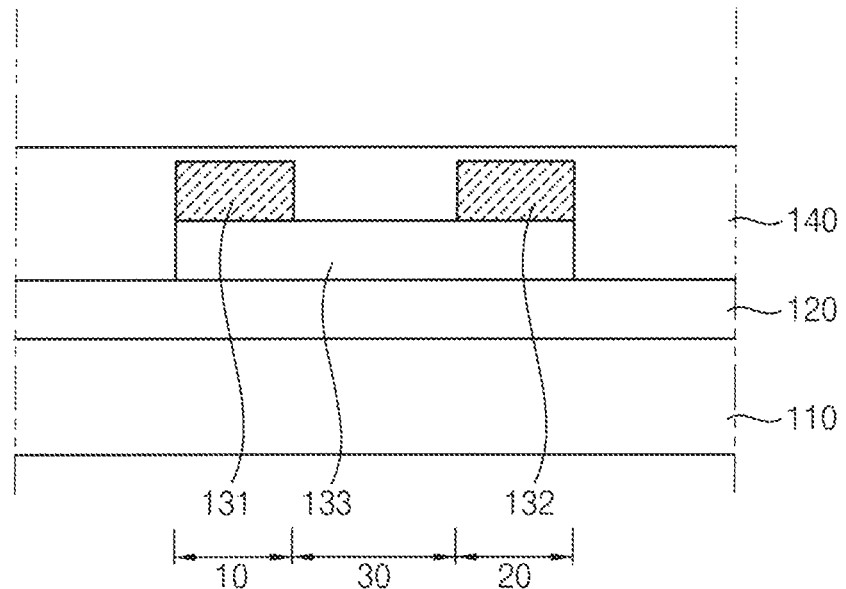

Referring to FIGS. 1 and 2E, the gate insulating layer 140 may be formed on the active pattern 133. The gate insulating layer 140 may cover the active pattern 133, the source electrode 131, and the drain electrode 132.

Figure 2F:
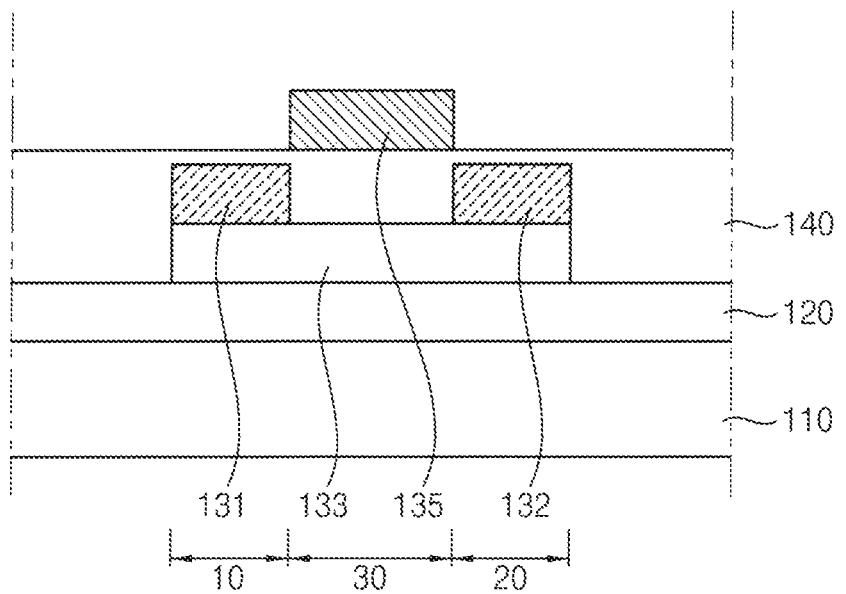

Referring to FIGS. 1 and 2F, the gate electrode 135 may be formed on the gate insulating layer 140 to overlap the third region 30 of the active pattern 133. The gate electrode 135 may be formed by etching a conductive pattern formed on the gate insulating layer 140. The gate electrode 135 may include a metal, an alloy, a metal nitride, a conductive metal oxide, a transparent conductive material, or the like.

Figure 2G:
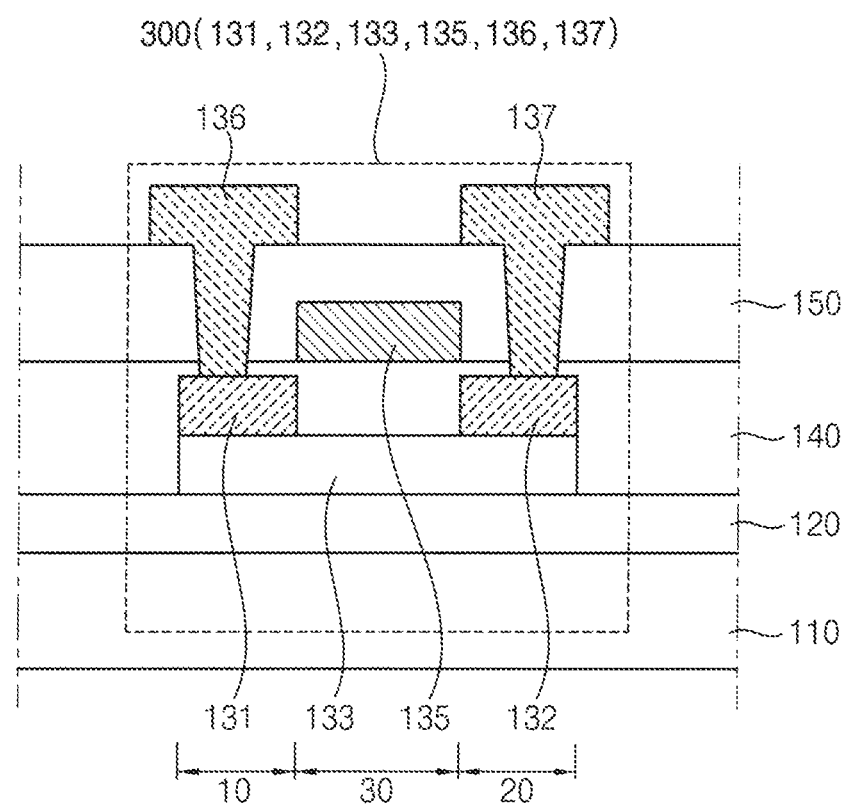

Referring to FIGS. 1 and 2G, the interlayer insulating layer 150 may be formed on the gate insulating layer 140. The interlayer insulating layer 150 may cover the gate electrode 135. The interlayer insulating layer 150 may entirely or substantially cover exposed portions of a face (e.g., the top face) of the gate insulating layer 140.

The source pattern 136 and the drain pattern 137 may be formed on the interlayer insulating layer 150. The first contact hole for exposing the source electrode 131 may be formed by removing portions of the interlayer insulating layer 150 and the gate insulating layer 140. The source pattern 136 may fill the first contact hole. The second contact hole for exposing the drain electrode 132 may be formed by removing portions of the interlayer insulating layer 150 and the gate insulating layer 140. The drain pattern 137 may fill the second contact hole. The source pattern 136 may be (directly) connected to the source electrode 131 through the first contact hole, and the drain pattern 137 may be (directly) connected to the drain electrode 132 through the second contact hole.

Referring to FIGS. 1 and 2G, the via insulating layer 160 covering the interlayer insulating layer 150, the source pattern 136, and the drain pattern 137 may be formed on the interlayer insulating layer 150. The pixel defining layer PDL may be formed on the via insulating layer 160. An organic light emitting diode (OLED) including the lower electrode 170, the emitting layer 180, and the upper electrode 190 may be formed on the via insulating layer 160. The organic light emitting diode (OLED) and the semiconductor element 300 may be electrically connected.

Although illustrative embodiments have been described, various modifications may be applicable to the illustrative embodiments and are within the scope of the appended claims.

What is claimed is:

1. A method of manufacturing a semiconductor element, the method comprising:
   preparing a substrate;
   forming a semiconductor layer on the substrate, wherein the semiconductor layer includes crystallized two-dimensional layers;
   forming a source electrode and a drain electrode on the semiconductor layer;
   forming a semiconductor member by wet etching the semiconductor layer using sodium hypochlorite, wherein the wet etching results in a residue; and
   removing the residue using purified water and an inert gas,
   wherein the crystallized two-dimensional layers include a transition metal dichalcogenide.

2. The method of claim 1, wherein the transition metal dichalcogenide includes at least one of molybdenum disulfide, molybdenum diselenide, and molybdenum ditelluride.

3. The method of claim 1 wherein the transition metal dichalcogenide is molybdenum disulfide, and
   the molybdenum disulfide is produced by synthesizing molybdenum chloride and hydrogen sulfide at a temperature in a range of 650 degrees to 750 degrees Celsius for a time length in a range of 13 minutes to 17 minutes.

4. The method of claim 1, wherein the transition metal dichalcogenide is molybdenum disulfide, and
   the molybdenum disulfide is produced by synthesizing molybdenum chloride and hydrogen sulfide at 700 degrees Celsius for 15 minutes.

5. The method of claim 1, wherein the transition metal dichalcogenide includes at least one of tungsten disulfide, tungsten diselenide, and tungsten ditelluride.

6. The method of claim 1, wherein the transition metal dichalcogenide includes at least one of zirconium disulfide and zirconium diselenide.

7. The method of claim 1, wherein the transition metal dichalcogenide includes at least one of hafnium disulfide and hafnium diselenide.

8. The method of claim 1, wherein the transition metal dichalcogenide includes at least one of platinum disulfide and platinum diselenide.

9. The method of claim 1, wherein the transition metal dichalcogenide includes at least one of rhenium disulfide and rhenium diselenide.

10. The method of claim 1, wherein the source electrode and the drain electrode are formed through a lithography process.

11. The method of claim 1, wherein the source electrode and the drain electrode include one or more of titanium and silver.

12. The method of claim 1, further comprising:
    forming a gate insulating layer on the semiconductor member;
    forming a gate electrode on the gate insulating layer; and
    forming an interlayer insulating layer on the gate electrode.

13. The method of claim 12, further comprising:
    forming a first contact hole in the interlayer insulating layer and the gate insulating layer, the first contact hole exposing the source electrode; and forming a source member on the interlayer insulating layer, the source member filling the first contact hole.

14. The method of claim 13, further comprising:
forming a second contact hole in the interlayer insulating layer and the gate insulating layer, the second contact hole exposing the drain electrode; and
forming a drain member on the interlayer insulating layer, the drain member filling the second contact hole.

15. The method of claim 1, wherein the inert gas contains nitrogen.

16. The method of claim 1, wherein the inert gas contains argon.

17. The method of claim 1, wherein the inert gas includes a mixed gas of nitrogen and argon.

18. The method of claim 1, wherein the sodium hypochlorite is applied through a dropper to the semiconductor layer.

19. The method of claim 1, further comprising:
forming a buffer layer on the substrate after the step of preparing the substrate and before the step of forming the semiconductor layer.

20. The method of claim 1, wherein the crystallized two-dimensional layers further include graphene.

21. The method of claim 20, wherein the graphene includes at least one of hexagonal boron nitride graphene, and boron nitride co-doped graphene.

* * * * *